(12) United States Patent
Aggarwal et al.

(10) Patent No.: US 10,535,390 B2
(45) Date of Patent: Jan. 14, 2020

(54) MAGNETORESISTIVE DEVICES AND METHODS THEREFOR

(71) Applicant: EVERSPIN TECHNOLOGIES, INC., Chandler, AZ (US)

(72) Inventors: Sanjeev Aggarwal, Scottsdale, AZ (US); Sarin A. Deshpande, Chandler, AZ (US); Jon Slaughter, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 8 days.

(21) Appl. No.: 15/831,736

(22) Filed: Dec. 5, 2017

(65) Prior Publication Data

US 2018/0158498 A1 Jun. 7, 2018

Related U.S. Application Data

(60) Provisional application No. 62/430,596, filed on Dec. 6, 2016.

(51) Int. Cl.
| | | |
|---|---|---|
| *H01L 29/82* | (2006.01) | |
| *H01L 21/8246* | (2006.01) | |
| *H01L 29/06* | (2006.01) | |
| *H01L 43/12* | (2006.01) | |
| *H01L 27/22* | (2006.01) | |
| *B44C 1/22* | (2006.01) | |
| *G11B 5/127* | (2006.01) | |
| *H01L 43/10* | (2006.01) | |

(Continued)

(52) U.S. Cl.
CPC .......... *G11C 11/161* (2013.01); *H01L 27/222* (2013.01); *H01L 27/226* (2013.01);
(Continued)

(58) Field of Classification Search
CPC . H01L 43/12; H01L 27/22; Y10T 428/24736; B82Y 25/00; B82Y 40/00;
(Continued)

(56) References Cited

U.S. PATENT DOCUMENTS

| | | |
|---|---|---|
| 2004/0108561 A1 | 6/2004 | Jeong |
| 2005/0002230 A1* | 1/2005 | Hosotani ................ B82Y 10/00 365/171 |

(Continued)

OTHER PUBLICATIONS

International Search Report and Written Opinion in PCT/US2017/064669, dated Apr. 5, 2018. (11 pages).

*Primary Examiner* — Brian Turner
(74) *Attorney, Agent, or Firm* — Bookoff McAndrews, PLLC

(57) ABSTRACT

The present disclosure is directed to exemplary methods of manufacturing a magnetoresistive device. In one aspect, a method may include forming one or more regions of a magnetoresistive stack on a substrate, wherein the substrate includes at least one electronic device. The method also may include performing a sole annealing process on the substrate having the one or more magnetoresistive regions formed thereon, wherein the sole annealing process is performed at a first minimum temperature. Subsequent to performing the sole annealing process, the method may include patterning or etching at least a portion of the magnetoresistive stack. Moreover, subsequent to the step of patterning or etching the portion of the magnetoresistive stack, the method may include performing all additional processing on the substrate at a second temperature below the first minimum temperature.

17 Claims, 7 Drawing Sheets

(51) Int. Cl.
  *G11C 11/16*  (2006.01)
  *H01L 43/02*  (2006.01)

(52) U.S. Cl.
  CPC ............ *H01L 27/228* (2013.01); *H01L 43/02* (2013.01); *H01L 43/12* (2013.01)

(58) Field of Classification Search
  CPC .. G01R 33/093; H01F 10/3272; H01F 41/308
  See application file for complete search history.

(56) References Cited

U.S. PATENT DOCUMENTS

| | | | |
|---|---|---|---|
| 2005/0128801 A1* | 6/2005 | Nickel | G11C 11/161 365/171 |
| 2009/0078927 A1* | 3/2009 | Xiao | H01L 43/12 257/9 |
| 2011/0121826 A1* | 5/2011 | Engel | B82Y 25/00 324/249 |
| 2011/0194341 A1* | 8/2011 | Gaidis | G11C 11/16 365/171 |
| 2011/0235217 A1 | 9/2011 | Chen et al. | |
| 2013/0082339 A1* | 4/2013 | Aggarwal | H01L 43/12 257/421 |
| 2015/0069542 A1* | 3/2015 | Nagamine | H01L 43/08 257/421 |
| 2015/0243883 A1* | 8/2015 | Swaminathan | H01L 43/12 438/761 |
| 2015/0249096 A1* | 9/2015 | Lupino | H01L 27/11898 257/203 |
| 2015/0357560 A1* | 12/2015 | Mudivarthi | H01L 43/12 438/3 |

\* cited by examiner

MAGNETORESISTIVE DEVICES AND METHODS THEREFOR

CROSS-REFERENCE TO RELATED APPLICATIONS

This application claims the benefit of U.S. Provisional Application No. 62/430,596, filed Dec. 6, 2016, the disclosure of which is incorporated herein by reference in its entirety.

TECHNICAL FIELD

The present disclosure relates to, among other things, embodiments and aspects related to the manufacturing of an integrated circuit device and the devices resulting therefrom.

INTRODUCTION

Magnetoresistive devices, such as magnetic sensors, magnetic transducers, and magnetic memory cells, include magnetic materials where the magnetic moments of those materials can be varied to provide sensing information or storage of data. Magnetoresistive devices, spin electronic devices, and spintronic devices are synonymous terms for devices that make use of effects predominantly caused by electron spin. Magnetoresistive memory devices are used in numerous information devices to provide non-volatile, reliable, radiation resistant, and high-density data storage and retrieval. The numerous magnetoresistive devices may include, but are not limited to, Magnetoresistive Random Access Memory (MRAM), magnetic sensors, and read/write heads for disk drives.

Manufacturing magnetoresistive devices includes a sequence of processing steps wherein multiple layers of materials are deposited on a semiconductor substrate having CMOS (complementary metal oxide semiconductor) circuitry thereon, and patterned to form a magnetoresistive stack. The magnetoresistive stack includes the various regions or layers of materials that make up "free" and "fixed" portions of the magnetoresistive device as well as one or more intermediate regions (e.g., dielectric layers or non-magnetic conductive layers) that separate these "free" and "fixed" portions, and in some cases, provide at least one tunnel junction for the device. In many instances, the layers of material in the magnetoresistive stack may be relatively very thin, e.g., on the order of a few or tens of angstroms. The term "free" refers to ferromagnetic regions having a magnetic moment that may shift or move significantly in response to applied magnetic fields or spin-polarized currents used to switch the magnetic moment vector of a "free" region. And, the term "fixed" refers to ferromagnetic regions having a magnetic moment vector does not move substantially in response to such applied magnetic fields or spin-polarized currents. Aspects of this disclosure describe techniques for manufacturing such magnetoresistive devices.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various described embodiments, as well as associated methods of manufacture. For ease of illustration, the figures depict the different regions along the thickness of the illustrated stacks as a layer having well defined boundaries with straight edges (e.g., depicted using lines). However, one skilled in the art would understand that, in reality, at an interface between adjacent regions or layers, the materials of these regions may alloy together, or migrate into one or the other material, and make their boundaries ill-defined or diffuse. That is, although multiple layers with distinct interfaces are illustrated in the figures, in some cases, over time and/or exposure to high temperatures, materials of some of the layers may migrate into or interact with materials of other layers to present a more diffuse interface between these layers. Further, although the figures illustrate each region or layer as having a relatively uniform thickness across its width, one of ordinary skill in the art would recognize that, in reality, the different regions may have a non-uniform thickness (e.g., the thickness of a layer may vary along the width of the layer), and/or the thickness of one region or layer may differ relative to the thickness of another (e.g., adjacent) region or layer.

In the figures and description, details of well-known features (e.g., interconnects, etc.) and manufacturing techniques (e.g., deposition techniques, etching techniques, etc.) may be omitted for the sake of brevity (and to avoid obscuring other features), since these features/technique are well known to those of ordinary skill in the art. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and to describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in reality, such regions/layers may be more "rounded" and/or gradually sloping. It should also be noted that, even if it is not specifically mentioned, aspects described with reference to one embodiment may also be applicable to, and may be used with, other embodiments.

Figure 1:
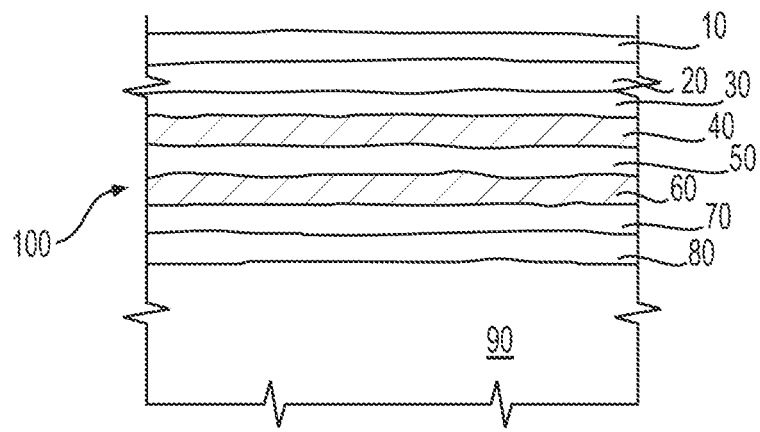
Figure 2:
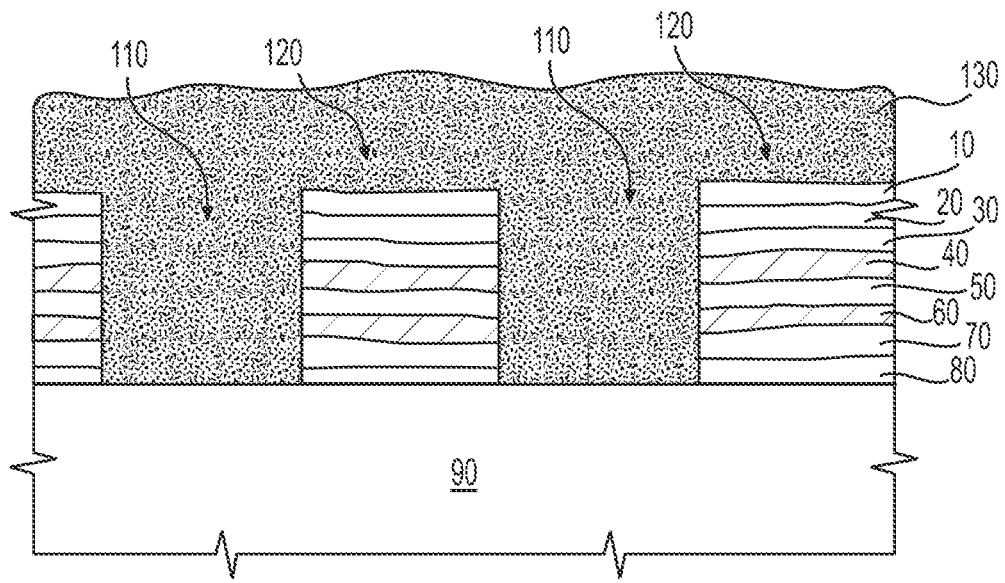
Figure 4A:
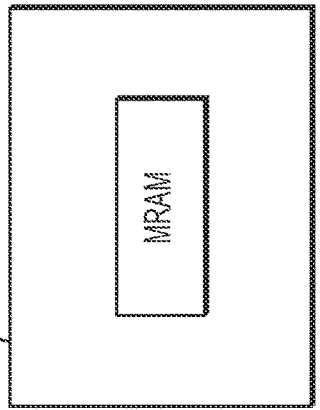
Figure 4B:
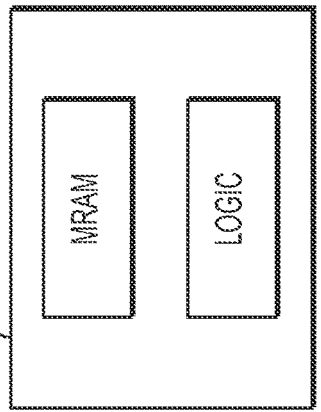
Figure 3:
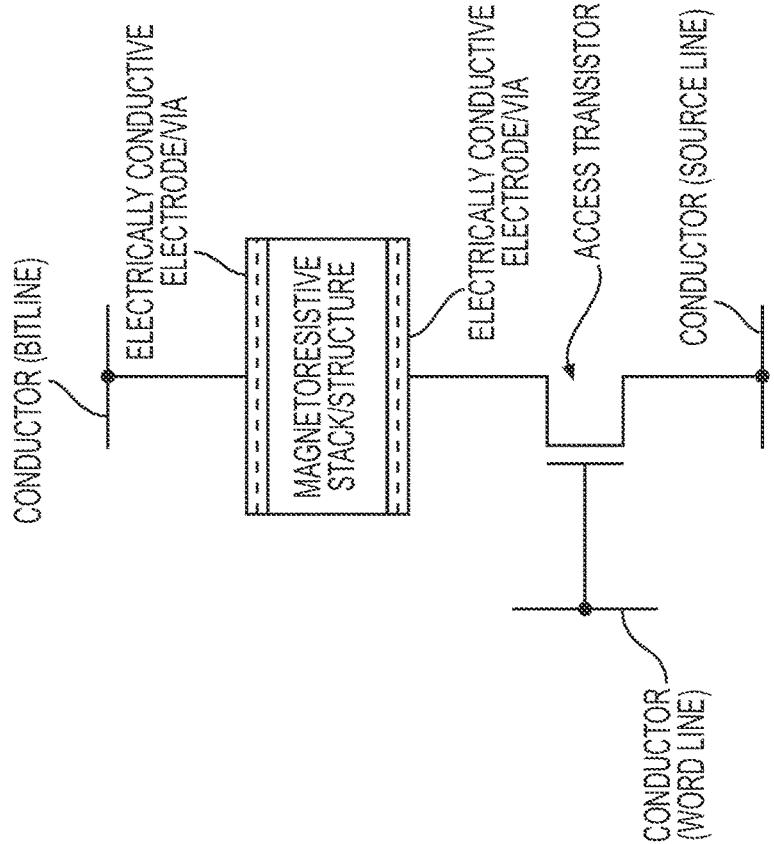

FIG. 1 is a cross-sectional schematic illustration of the structure of an exemplary magnetoresistive stack/structure of the current disclosure;

FIG. 2 is a cross-sectional schematic illustration of exemplary magnetoresistive bits formed using the magnetoresistive stack/structure of FIG. 1;

FIG. 3 is a schematic diagram of an exemplary magnetoresistive memory element electrically connected in a magnetoresistive memory cell configuration;

FIG. 4A is a schematic block diagram illustrating an exemplary discrete memory device that includes an exemplary memory element of the current disclosure;

FIG. 4B is a schematic block diagram illustrating an exemplary embedded memory device that includes a memory element of the current disclosure; and FIGS. 5-9 are flow charts that illustrate exemplary manufacturing flows (or processes/methods) for the formation of an exemplary magnetoresistive device, according to the present disclosure.

There are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, means the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a process, method, article, or apparatus that uses such terms does not include only those steps, structure, or elements, but may include other elements and steps not expressly listed or inherent to such process, method, article, or apparatus. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item. Additionally, in this disclosure, a listed range is intended to cover both the end points (for example, a temperature range between about 400-500° C., as used herein, includes any temperature ≥about 400° C. and ≤about 500° C.).

In this disclosure, the term "region" is used generally to refer to one or more layers of material. That is, a region (as used herein) may include a single layer (or film or coating) of material or multiple layers or coatings (or films) of materials stacked one on top of another to form a multi-layer system. Further, although in the description below, the different regions in the disclosed stack/structure are sometimes referred to by specific names (such as, e.g., capping layer, reference layer, transition layer, etc.), this is only for ease of description and not intended as a functional description of the layer.

As alluded to above, in one exemplary aspect, the magnetoresistive device of the present disclosure, formed from a magnetoresistive stack/structure, may be used in a magnetic tunnel junction type device (MTJ device). The MTJ device may be implemented, for example, as a spin-torque magnetoresistive random access memory ("MRAM") element ("memory element"), a magnetoresistive sensor, a magnetoresistive transducer, etc. In such aspects, the magnetoresistive stack/structure may include an intermediate layer positioned (or sandwiched) between two ferromagnetic regions/layers. The intermediate layer may be a tunnel barrier and may include an insulating material, such as, e.g., a dielectric material. In other embodiments, the intermediate layer may be a conductive material, including, but not limited to, a non-magnetic conductive material such as, e.g., copper, gold, or alloys thereof. In such embodiments, where the magnetoresistive stack/structure includes a conductive material in between two ferromagnetic regions/layers, the magnetoresistive stack/structure may form a Giant magnetoresistive (GMR) or GMR-type device.

For the sake of brevity, conventional manufacturing techniques related to semiconductor processing may not be described in detail herein. The exemplary embodiments may be fabricated using known manufacturing techniques and processes, including, but not limited, lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied, whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive device, e.g., a magnetic tunnel junction bit (MTJ bit) or a magnetic tunnel junction (MTJ device) type device, from a magnetoresistive stack/structure. The magnetoresistive stack/structure may include, or may be operably coupled to, one or more electrically conductive electrodes, vias, or conductors on either side of a magnetic material stack. As described in further detail below, the magnetic material stack may include many different regions or layers of material, where some of the layers include magnetic materials, whereas others do not. In one embodiment, the methods of manufacturing may include sequentially depositing, growing, sputtering, evaporating, and/or providing (collectively referred herein as "depositing" or other verb tense (e.g., "deposit" or "deposited")) layers and regions which, after further processing (for example, etching) those layers form a magnetoresistive stack/structure.

The described magnetoresistive stacks/structures may be formed between a top electrode/via/line and a bottom electrode/via/line, both of which may permit access to the stack/structure by allowing for connectivity (for example, electrical) to circuitry and other elements of the magnetoresistive device. Between the electrodes/vias/lines are layers and/or regions, the described magnetoresistive stack/structure may include at least one "fixed" magnetic region (which may include, among other things, a plurality of ferromagnetic layers), at least one "free" magnetic region (which may include, among other things, a plurality of ferromagnetic layers), and one or more intermediate layers or regions disposed between a "fixed" magnetic region and the "free" magnetic region. In some embodiments, the one or more intermediate layers or regions may be a dielectric layer or region. In other embodiments, however, the one or more intermediate layers or regions may be a conductive layer or region. In some embodiments, the top electrode (and/or the bottom electrode) may be eliminated, and the bit line may be formed on top of the magnetoresistive stack.

FIG. 1 illustrates a cross-sectional view of an exemplary magnetoresistive stack/structure 100 formed on a surface of a semiconductor substrate 90 having, e.g., CMOS (complementary metal oxide semiconductor) circuitry (e.g., transistors, etc.) formed thereon. The magnetoresistive stack 100 may include any type of in-plane or out-of-plane magnetic anisotropy magnetoresistive stack/structure (e.g., a perpendicular magnetic anisotropy magnetoresistive stack/structure), and the magnetoresistive stack 100 may have multiple regions (10, 20, 30, etc.) formed one on top of another. For the sake of brevity, in the discussion below, the magnetoresistive stack/structure 100 is referred to as a "magnetoresistive stack." It will be recognized that several other commonly-used regions (or layers) (e.g., various protective cap layers, spacer layers, reference layers, insertions, seed layers, etc.) are not illustrated in FIG. 1 (and in subsequent figures) for clarity. Each of the regions (e.g., regions 10, 20, 30, etc.) of magnetoresistive stack 100 may comprise one or more layers of material.

Magnetoresistive stack 100 of FIG. 1 may include intermediate regions 40 and 60 (such as, for example, a dielectric layer or a conductive layer (e.g., a non-magnetic conductive layer)) disposed between magnetic material regions 30 and 50 and magnetic material regions 50 and 70. In a fabricated magnetoresistive device (e.g., MRAM, etc.), the magnetic material regions 30, 70 may function as a "fixed" magnetic region, the magnetic material region 50 may function as a "free" magnetic region, and the intermediate regions 40, 60 may function as tunnel barriers. As illustrated in FIG. 1, regions 30, 40, 50, 60, and 70 may be sequentially formed (e.g., deposited) between electrically conductive regions 20 and 80 that function as electrodes (e.g., top and bottom electrodes) of the magnetoresistive stack 100. In some embodiments, one or both of regions 20 and 80 may be eliminated, for example, by positioning the bit line (of the MRAM) on top of the stack 100 and positioning the stack 100 on a conductive region of the CMOS circuitry on substrate 90 (metallization layer, redistribution layer, etc.). In some embodiments, as illustrated in FIG. 1, a hardmask region 10 may also be provided on the stack 100 to assist in the subsequent processing (etching, patterning, etc.) of the magnetoresistive stack 100.

Regions 30 and 70 may serve as a "fixed" magnetic region, and region 50 may serve as a "free" magnetic region of magnetoresistive stack 100. That is, a magnetic moment vector in a "fixed" region(s) 30, 70 does not move significantly in response to applied magnetic fields (e.g., an external field) or applied currents used to switch the magnetic moment vector of "free" region 50, as explained above. Regions 30, 50, 70 are illustrated as a single layer in FIG. 1 only for the ease of illustration. As explained previously, in some embodiments, each of these regions (e.g., regions 30, 50, 70) may comprise several layers of a magnetic or a ferromagnetic material formed one on top of another. In addition, regions 30, 50, and 70 may also include additional layers, including, but not limited to, an antiferromagnetic coupling layer, a reference layer, an insertion layer, and/or a transition layer. The intermediate regions 60 and 40, positioned between regions 70 and 50 and regions 50 and 30, respectively, may include a dielectric material, and may function as a tunnel barrier in the magnetoresistive stack 100. However, it is also contemplated that, one or both of the intermediate regions 40, 60 may include a conductive material (e.g., copper) to form a GMR-type magnetoresistive stack/structure.

The magnetoresistive stack 100 of FIG. 1 is only exemplary. Many other configurations of the magnetoresistive stack are possible. Some exemplary magnetoresistive stacks and fabrication methods are described in U.S. Pat. Nos. 8,686,484; 8,747,680; 9,023,216; 9,136,464; and 9,419,208, each assigned to the assignee of the current application and incorporated by reference in its entirety herein. Each of these stacks/structures may be used in connection with the current disclosure. When implemented in an MTJ-like memory device, the magnetoresistive stack 100 of FIG. 1 may be referred to as having a dual spin filter (DSF) structure with a first MTJ comprising regions 70, 60, and 50, and a second MTJ comprising regions 30, 40, and 50. In some embodiments (not shown), a magnetoresistive stack may only include a single MTJ. That is, for example, in an exemplary magnetoresistive stack, regions 30 and 40 of FIG. 1 may be eliminated and the stack may only include a single MTJ comprising regions 70, 60, and 50. Since the materials and structure (e.g., thicknesses, etc.) of the magnetoresistive stack 100 are known to those of ordinary skill in the art, and are described in several patents assigned to the assignee of the current application (e.g., described in U.S. Pat. Nos. 8,686,484; 8,747,680; 9,023,216; 9,136,464; and 9,419,208), for the sake of brevity, they are not described herein.

After the multi-layer magnetoresistive stack 100 of FIG. 1 is formed (e.g., by deposition, etc.) on substrate 90, the multi-layer structure may be further processed (patterned, interconnected, etc.) to form a magnetoresistive device. For example, the magnetoresistive stack 100 (of FIG. 1) may be etched to form a plurality of spaced-apart magnetic tunnel junction bits (and/or other structures) and further processed to form the magnetoresistive device. FIG. 2 illustrates the magnetoresistive stack 100 of FIG. 1 etched in an exemplary pattern to form multiple magnetoresistive bits (MTJ bits 120) spaced apart from each other at a desired pitch, and encapsulated by depositing a dielectric material 130 over the MTJ bits 120. The encapsulated MTJ bits 120 may be further processed, for example, by etching trenches and vias on the dielectric material (e.g., via a single damascene process, dual damascene process, etc.) and depositing an electrically conductive material on the etched trenches and vias to interconnect the MTJ bits 120 and form a magnetoresistive device (MTJ device) as illustrated in FIG. 3.

As alluded to above, the MTJ device (formed using MTJ bits 120) may include a sensor architecture or a memory architecture (among other architectures). For example, in an MTJ device having a memory configuration, the MTJ bits 120 may be electrically connected to an access transistor and configured to couple or connect to various conductors, which may carry one or more control signals, as shown in FIG. 3. The MTJ device may be used in any suitable application, including, e.g., in a memory configuration. In such instances, the MTJ devices may be formed as integrated circuits comprising a discrete memory device (e.g., as shown in FIG. 4A) or an embedded memory device having a logic therein (e.g., as shown in FIG. 4B), each including MRAM, which, in one embodiment is representative of one or more arrays of MRAM having a plurality of magnetoresistive stacks/structures, according to certain aspects of certain embodiments disclosed herein.

An exemplary method of fabricating a selected embodiment of an MTJ device will now be described. It should be appreciated that the described method is merely exemplary. There are many inventions described and illustrated herein, as well as many aspects and embodiments of those inventions. In one aspect, for example, the present disclosure is directed to methods and processes to anneal the transistors and magnetoresistive stacks/structures in/on an integrated circuit (for example, a stand alone MRAM IC or embedded MRAM IC (e.g., high density MRAM and embedded MRAM wherein the magnetoresistive stacks/structures have perpendicular anisotropy)). In another aspect, the present disclosure is directed to IC fabricated in accordance with the methods and processes described herein.

The fabrication techniques described below employ or implement a transistor anneal process after deposition or formation of the layers or regions of a magnetoresistive stack 100 (e.g., an MTJ stack in some embodiments)—but before completion of the MTJ stack formation (e.g., before completion of etch/pattern/formation processes to form the MTJ stack/bit (for example, before etching/patterning of the magnetoresistive memory cell or magnetoresistive sensor)).

In some embodiments, the method may include a number of additional or alternative steps, and in some embodiments, one or more of the described steps may be omitted. Any described step may be omitted or modified, or other steps added, as long as the intended functionality of the magnetoresistive device remains substantially unaltered. Although a certain order is described or implied in the described method, in general, the steps of the described method need not be performed in the illustrated and described order. Further, the described method may be incorporated into a process of fabricating an MTJ bit from the described MTJ device. Since the additional steps needed to form an MTJ device are known to those of ordinary skill in the art, they are not described herein. Additionally, the described method may be incorporated into a more comprehensive procedure or process having additional functionality not described herein.

Figure 5:
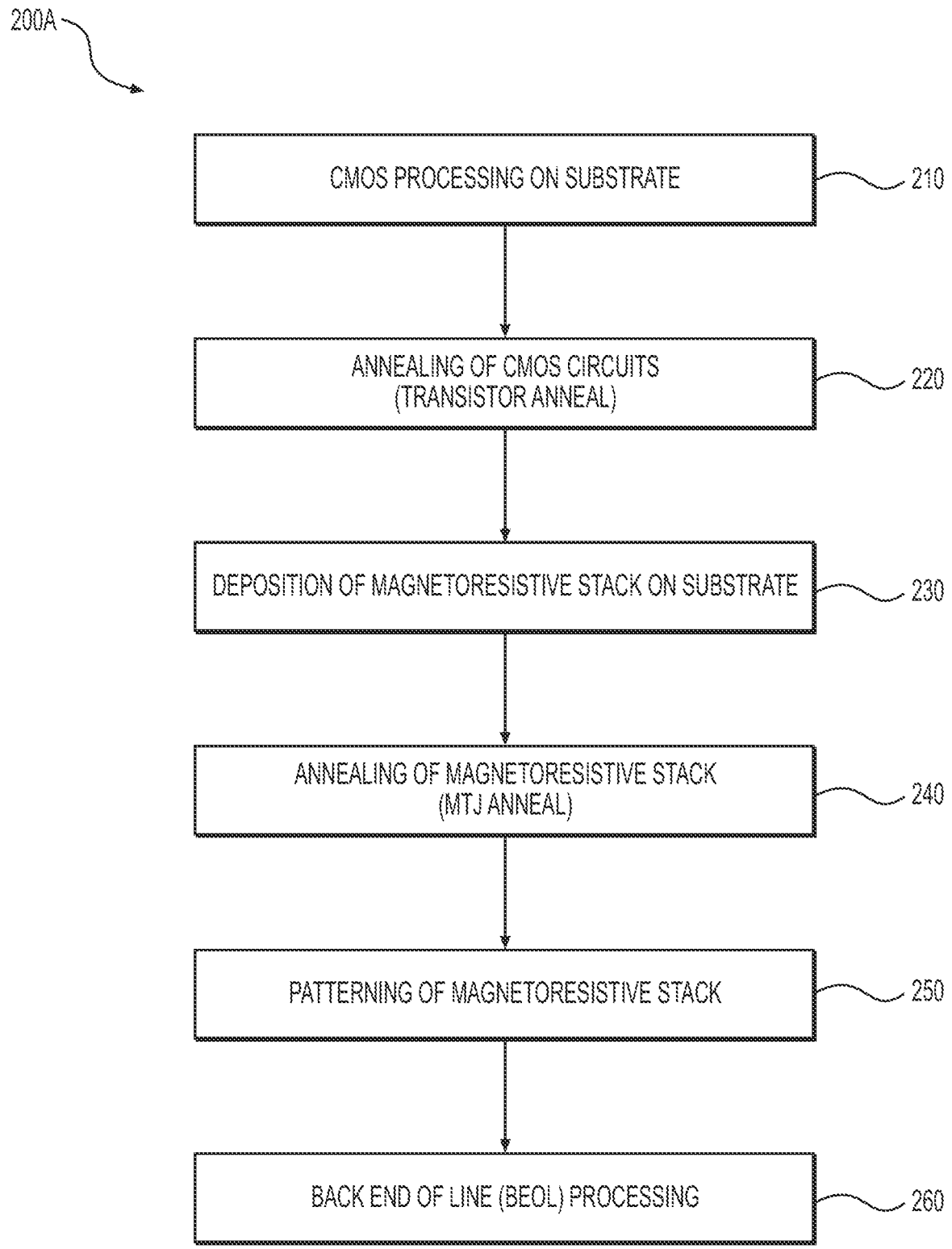

FIG. 5 depicts a flow chart of an exemplary method 200A of fabricating an exemplary MTJ device. CMOS processing may first be carried out on a semiconductor substrate (step 210). As known to those of ordinary skill in the art, CMOS processing may include formation of transistors and/or other integrated circuit devices on the semiconductor substrate 90 (of FIG. 1), interconnecting the transistors and devices in a desired pattern to form CMOS circuits, and forming metallization (bond pads, etc.) on an exposed surface of the substrate 90 to access these CMOS circuits. The CMOS circuits may then be annealed (step 220) to improve the electrical characteristics and reliability of the CMOS transistors and circuits. In some embodiments, annealing of the CMOS circuits may be performed by exposing the substrate 90 with CMOS circuits to a high pressure and high temperature (e.g., greater than about 300° C., between 350-550° C., less than 550° C., etc.) in deuterium, hydrogen, or other desired atmosphere. Annealing of the CMOS circuits (i.e., step 220) will hereinafter be referred to as "transistor anneal." Transistor anneal (i.e., step 220) may include any now-known or future developed annealing process. As is known in the art, transistor anneal improves the electrical characteristics of the transistors and the CMOS circuits on the substrate 90 by, for example, activating dopants, changing film-to-film or film-to-wafer substrate interfaces, densifying deposited films, changing states of grown films, repairing damage from implants, moving or driving dopants from one film into another or from a film into the wafer substrate, etc.

A magnetoresistive stack (e.g., stack 100 of FIG. 1) may then be formed on the substrate 90 (step 230). Forming the magnetoresistive stack may include sequentially depositing (and/or growing, sputtering, etc.) the multiple regions of the magnetoresistive stack 100 on the CMOS circuits of the substrate 90. Any now-known (e.g., chemical vapor deposition, sputter deposition, etc.) or future developed process of depositing materials on the substrate 90 may be used to form the magnetoresistive stack 100. The formed magnetoresistive stack 100 may then be annealed (step 240). As known to those of ordinary skill in the art, annealing the magnetoresistive stack 100 (hereinafter referred to as an "MTJ anneal") may set the magnetic domains of different regions of the magnetoresistive stack 100 in the desired directions. MTJ annealing (i.e., step 240) may be performed by exposing the substrate 90 with the magnetoresistive stack 100 formed thereon to a high temperature. In general, MTJ anneal may include any now-known or future developed annealing process. In some embodiments, MTJ anneal may include the same temperature and/or atmospheric (pressure, ambient, etc.) conditions as transistor anneal (i.e., step 220). In some embodiments, MTJ anneal may include exposing the substrate 90 with the stack 100 to a temperature greater than about 300° C., or between about 300-500° C. In some embodiments, the substrate 90 with the magnetoresistive stack 100 may also be subject to a magnetic field during MTJ anneal.

The magnetoresistive stack 100 formed on the substrate 90 may then be patterned (step 250). Patterning the stack 100 may include etching through the different regions of the stack to form a plurality of MTJ bits (e.g., MTJ bits 120 of FIG. 2). Any now-known (e.g., sputter etching, ion beam etching (IBE) or milling, reactive ion beam etching (RIE) or milling, etc.) or later developed etching process may be used to etch through the different regions of the magnetoresistive stack 100. In some embodiments, step 250 may include depositing a photo resist on (or above) the hardmask region 10 and patterning the photoresist (e.g., using lithographic techniques) to expose areas or region 10 corresponding to the desired dimensions of the MTJ bits 120. The hardmask region 10 may then be etched using a suitable etching technique to transfer the photo resist pattern to region 10 (e.g., remove region 10 from the exposed areas). The multiple regions (e.g., regions 20, 30, 40, 50, 60, 70, 80) of the magnetoresistive stack 100 may then be etched (using, for e.g., RIE, IBE, etc.) with region 10 "protecting" or masking the areas covered by the remaining portions of region 10, to form a plurality of MTJ bits 120 separated by trenches 110 (see FIG. 3).

As known to those of ordinary skill in the art, IBE and RIE use beams of charged ions (comprising one or more of Argon, Krypton, Xenon, etc.) to etch through multiple regions of the magnetoresistive stack 100 and form the trenches 110. The impact of the ions ablades the areas of the stack 100 not covered by region 10. In some embodiments, a portion of the nonvolatile byproducts of the etched regions may redeposit on the side walls of the MTJ bits 120 (e.g., as a veil) during the etching and detrimentally affect the resistance and magnetic property distribution within the formed MTJ bits 120. Therefore, in some embodiments, the redeposited debris may be removed from the side walls of the MTJ bits 120. The redeposited debris may be removed by any now-known (e.g., angled etch) or future developed process. Thus, in some embodiments, patterning the magnetoresistive stack 100 (i.e., step 250) may also include cleaning the side walls of the MTJ bits to remove the redeposited debris.

In some embodiments, patterning the magnetoresistive stack 100 (i.e., step 250) may include etching a plurality of the regions, but less than all of the regions, of the magnetoresistive stack 100. That is, the etching process may be terminated at a desired region of the stack (e.g., at an interface of or within region 60, which as previously explained, may function as a tunnel barrier in a completed MTJ device) to form partially formed MTJ bits. A first encapsulant may then be deposited on the partially formed MTJ bits, and used as a spacer or a mask to etch the remainder of the stack and form MTJ bits 120.

After patterning the magnetoresistive stack 100, back end of line (BEOL) processing may be carried out to form an MTJ device from the MTJ bits 120 (step 260). BEOL processing may include depositing an encapsulant 130 (see FIG. 2) on the patterned MTJ bits 120 to form a conformal coating over the bits 120. The encapsulant 130 may serve as an interlayer dielectric (ILD), and may, in general, include any electrically nonconductive material (such as, for example, silicon nitride, silicon oxide, a low-k ILD material (e.g., carbon doped $SiO_2$, carbon doped oxide, organo silicate glass, spin-on organics, etc., or combinations thereof). Any suitable process (e.g., chemical vapor deposition, atomic layer deposition, etc.) may be used to deposit the encapsulant 130. After depositing the encapsulant 130, BEOL processing may include additional processing steps (such as, for example, polishing a top surface of the structure to expose a conductive region of the MTJ bits 120, forming a bit contact structure on the exposed regions of the MTJ bits 120 to make electrical contact with these MTJ bits 120, forming top contact, bond pads, bit lines, etc.) to fabricate an MTJ device from the MTJ bits 120. Since these additional processing steps are known to those of ordinary skill in the art, they are not described herein for the sake of brevity. Some of the processing during BEOL processing (step 260) (e.g., deposition of ILD, etc.) may involve exposing the patterned MTJ bits 120 to a relatively high temperature. In some embodiments, during BEOL processing (step 260), the annealed MTJ bits may be exposed to temperatures as high as, or higher than, the temperatures associated with the aforementioned described annealing steps (steps 220 and 240).

As illustrated in FIG. 5, method 200A involves performing a second high temperature anneal (i.e., MTJ anneal) after a first high temperature anneal (i.e., transistor anneal). Performing the MTJ anneal after the transistor anneal may, to a certain extent, reduce the beneficial effects of the transistor anneal step (i.e., step 220) and degrade the characteristics and reliability of the transistors in the substrate 90. Therefore, in some embodiments, the transistor anneal step 220 may be performed after BEOL processing (i.e., after forming the MTJ bits 120).

Figure 6:
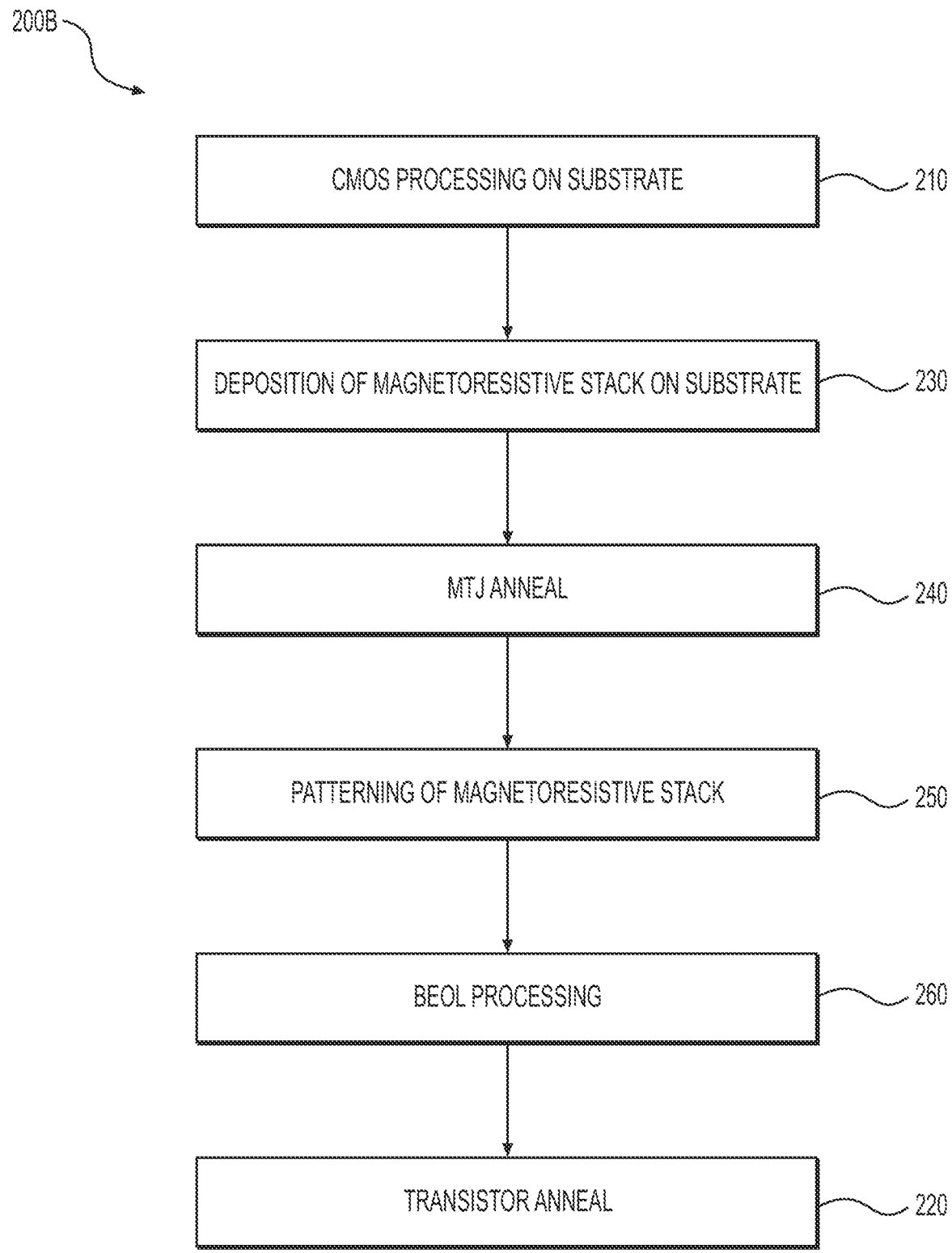

FIG. 6 is a flow chart of another exemplary method 200B of fabricating an MTJ device where the transistor anneal (step 220) is performed after BEOL processing (step 260). Since the details of each step of FIG. 6 is substantially similar to the corresponding step of FIG. 5, they are not described again. Performing the transistor anneal (i.e. step 220 of FIG. 6) after MTJ anneal (i.e., step 240 of step 6) may, in some cases, reduce the beneficial effects of MTJ annealing on the MTJ bits and cause degradation in the characteristics and reliability of the MTJ bits 120, for example, due to encroachment. Therefore, in some embodiments, the annealing steps may be combined as described below.

Figure 7:
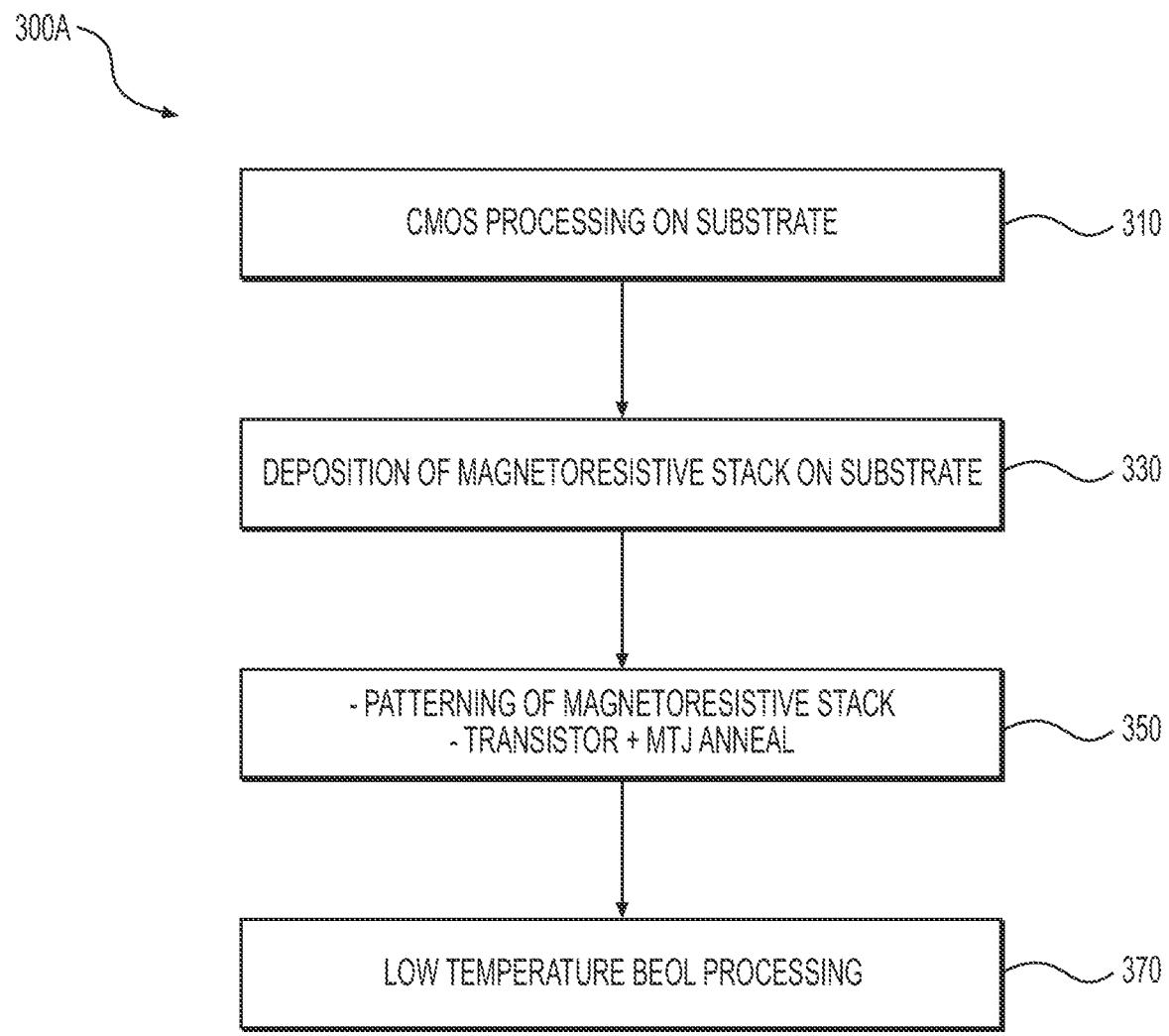

FIG. 7 is a flow chart of an exemplary method 300A of fabricating an MTJ device by combining the annealing steps. In method 300A, after CMOS processing on the substrate 90 (step 310), the multiple regions of the magnetoresistive stack 100 (e.g., of FIG. 1) are formed on the substrate (step 330). Since the processing of steps 310 and 330 of FIG. 7 are substantially similar to that of steps 210 and 230 (respectively) of FIGS. 5 and 6, they not described again. The magnetoresistive stack 100 is then patterned and the transistor(s) and MTJ are annealed in one step (step 350). That is, in method 300A of FIG. 7, patterning of the magnetoresistive stack 100 and annealing of the transistors in the substrate 90 (i.e., transistor anneal) and the annealing of the magnetoresistive stack 100 on the substrate 90 (i.e., MTJ annealing) are performed in one step, or in one process module. For example, the transistor anneal process and the MTJ anneal process may be combined into the etch or patterning process. Alternatively, the transistor and MTJ anneal may be performed together immediately after the magnetoresistive stack 100 is patterned in step 350.

In some embodiments, a transistor anneal step may be performed after deposition of the magnetoresistive stack 100 but before completion of the etch and pattern formation processes used to form the MTJ bits 120 (for example, before etching/patterning of the MTJ bits of the magnetoresistive memory cell). In some embodiments, however, step 350 may include implementing a combined transistor and MTJ anneal after deposition of certain layers of magnetoresistive stack 100 (including, e.g., deposition of a top electrode, e.g., region 20) but before the etch and pattern formation processes used to form the MTJ bits 120 (for example, before etching/patterning of the MTJ bits of the magnetoresistive memory cell). More specifically, the combined transistor and MTJ annealing of step 350 may be performed before (for example, immediately before) etching/patterning of, e.g., region 40 or 60 (i.e., a dielectric tunnel barrier layer). For example, the combined transistor and MTJ annealing of step 350 may be performed after deposition/formation of the mask employed to etch or otherwise pattern, e.g., region 40 or 60, and before etching or patterning of, e.g., region 40 or 60.

In some embodiments, the combined transistor and MTJ annealing of step 350 may be performed between the etching steps. That is, some regions of the magnetoresistive stack 100 may first be etched (e.g., to within, or to a top or a bottom interface of, e.g., region 40 or 60 (i.e., the tunnel barriers) of FIG. 1) and then subject to the combined annealing step. The remaining regions of the stack 100 may then be etched after annealing. For example, the combined transistor and MTJ annealing of step 350 may be performed after deposition of one or more layers of the magnetoresistive stack 100 but before completely forming the magnetoresistive stack 100 or MTJ bit 120. Specifically, in one aspect, the combined transistor and MTJ annealing of step 350 may be performed before patterning the, e.g., region 40 or 60 (e.g., the tunnel junction of MTJ bit 120) and/or before patterning one or both of fixed magnetic regions 30, 70.

In some embodiments, the combined transistor and MTJ anneal may be performed in between the lithographic and etching steps during patterning. In some embodiments, the combined transistor and MTJ anneal may be performed after the deposition of the magnetoresistive stack including the deposition of the top electrode (i.e., region 20 of FIG. 1) if any, but before etching/patterning. In some embodiments, the combined transistor and MTJ anneal may be performed after the deposition of the hard mask region 10, but before (e.g., immediately before) etching/patterning. In some embodiments, the combined transistor and MTJ anneal may be performed after deposition of the regions of the magnetoresistive stack 100 but before completion of the MTJ bit 120 (for example, before patterning of the magnetic tunnel junction (i.e., region 40 or region 60 of FIG. 1) and/or the "fixed" magnetic region (region 30 or region 70). In some embodiments, the combined transistor and MTJ anneal may be performed after (e.g., immediately after) patterning of the magnetic tunnel junction and/or the "fixed" magnetic region of the magnetoresistive stack. It should be noted that, in addition to the specific examples discussed above, the combined annealing step may be incorporated into the patterning process flow in other ways. For example, the transistor anneal process and MTJ anneal process may be combined into one etch process, or implemented or performed in any order. That is, even though the figure and the aforementioned description refers to the combined "transistor and MTJ" anneal, those of ordinary skill in the art will understand that combined annealing step may be an "MTJ and transistor" anneal process.

The combined transistor and MTJ annealing of step 350 may include exposing the substrate 90 with the MTJ stack 100 to any predetermined temperature, pressure, and/or an atmospheric profile. This profile may include exposing the stack to a constant temperature (pressure, or atmospheric condition) for a specific time, or may include exposing the stack to a time varying (step wise or continuously varying) temperature (pressure, or atmospheric condition). In some embodiments, the combined transistor and MTJ anneal step may be combined into one single process (e.g., exposing the substrate with the stack 100 to a single common temperature, pressure, and/or atmospheric profile). However, this is not a requirement. In some embodiments, the combined transistor and MTJ annealing may include sequentially subjecting the stack 100 to (i) transistor annealing and (ii) MTJ annealing (in any order). For example, in some embodiments, the substrate 90 with the stack 100 may be first subjected to transistor anneal and then to MTJ anneal. That is, the substrate with the stack 100 may be first exposed to a temperature, pressure, and/or atmospheric profile which corresponds to transistor anneal, and then be exposed to a second temperature, pressure, and/or atmospheric profile which corresponds to MTJ anneal. In some embodiments, the substrate 90 with the stack 100 may be first subjected to MTJ anneal and then to transistor anneal. In some embodiments, the combined transistor and MTJ annealing of step 350 may include exposing the MTJ stack 100 to a high temperature (for example, greater than about 300° C., between 300-550° C., etc.) at high pressure in a selected atmospheric ambient (e.g., under atmosphere of deuterium, hydrogen, etc.). In some embodiments, the combined transistor and MTJ annealing of step 350 may include exposing the MTJ stack 100 to a temperature of between about 300° C. to about 500° C. (in some embodiments, to a temperature ≤about 500° C., or ≥about 300° C., or between about 400-500° C.), a pressure between about 1 atmosphere (atm) to about 6 atms (in some embodiments, to a pressure ≤about 6 atms, or ≥1 atm, or between about 2-6 atms, or between about 3-5 atms), for a time between about 15 minutes to about 3 hours (in some embodiments, to a time ≤about 3 hours, or ≥about 15 mins, or between about 15-60 minutes, between about 1-3 hours, or between about 2-4 hours). In some embodiments, the combined transistor and MTJ annealing of step 350 may include exposing the MTJ stack 100 to substantially the same or similar conditions (temperature profile, pressure, atmosphere) as the individual transistor anneal and MTJ anneal steps (i.e., steps 220 and 240) of FIGS. 5 and 6.

After patterning and annealing the magnetoresistive stack 100 to form the MTJ bits 120 (step 350), low temperature BEOL processing may be carried out to form an MTJ device from the MTJ bits 120 (step 370). As explained with reference to step 260 of FIG. 5, BEOL processing (which includes, but is not limited to, encapsulating the MTJ bits 120 and/or forming a bit contact structure to make electrical contact with the MTJ bits 120) may subject the MTJ bits to a high temperature (in some cases, temperatures as high as, or higher than, the transistor and MTJ annealing step of step 350). These high temperature may, in some cases, affect the characteristics of the transistors and/or the MTJ bits. To reduce the effect of BEOL processing on the characteristics of the device, in low temperature BEOL processing (i.e., step 370), the maximum temperature that the bits are exposed to may be below the temperature limitations/specifications of the transistors and/or the MTJ bits 120. In some embodiments, the maximum temperature that the stack 100 is exposed to during step 370 may be less than (or in some cases equal to) the maximum temperature that the stack 100 is exposed to during any of the annealing (i.e., in step 350) steps. In some embodiments, the maximum temperature during step 370 (i.e., low temperature BEOL processing) may be between about 0 and 400° C. (including 400° C.), or less than about 400° C., or less than or equal to about 250° C., or between about 250° C. and 400° C., or between about 250° C. and 300° C., or less than about 300° C.

Figure 8:
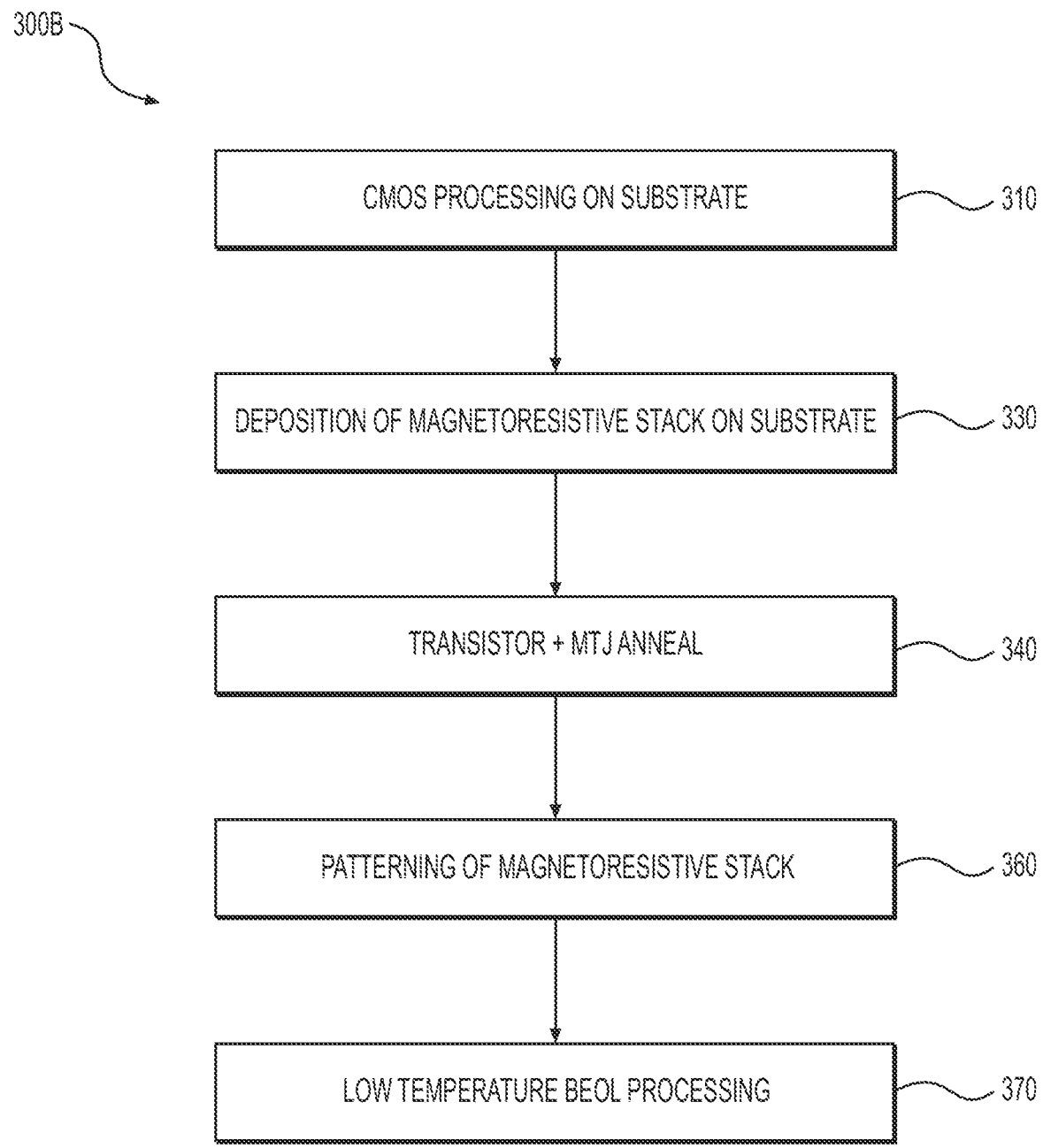

FIG. 8 is a flow chart of another exemplary method 300B of fabricating an MTJ device by combining transistor and MTJ annealing. In method 300B, the transistor anneal and the MTJ anneal processes are combined into a single annealing process (i.e., step 340) that is performed after depositing all the regions of the magnetoresistive stack 100 (i.e., step 330) and before patterning the magnetoresistive stack to form MTJ bits 120 (i.e., step 360). This annealing step (i.e., step 340) may subject the MTJ bits 120 to a temperature, pressure, and/or atmospheric profile to achieve annealing of both the transistors and the magnetoresistive stack 100. As described in greater detail below, the combined annealing step 340 may include a single process that changes temperatures over time. For example, in some embodiments, step 340 may include exposing the magnetoresistive stack 100 to a single temperature (pressure, and/or atmospheric) profile as opposed to two distinct profiles (i.e., profiles associated with transistor and MTJ anneal, respectively) performed sequentially. In some embodiments, the transistor and MTJ annealing step (step 340) may be subject to individual, specific, or particular thermal budgets relating to the transistors and the magnetoresistive stack 100 or MTJ bits 120. After the combined annealing of step 340, MTJ bits 120 may be patterned as described above, step 360. Subsequently, low temperature BEOL processing (step 370) may be carried out on the MTJ bits 120 to, e.g., completely the process of forming an MTJ device. As explained with reference to step 370 of FIG. 7, the maximum temperature that the bits are exposed to during low temperature BEOL processing may be below the temperature limitations/specifications of the transistors and/or the MTJ bits, or at or below the maximum temperature that the stack is subject to during the combined annealing of the transistors and magnetoresistive stack 100 (i.e., step 340).

Figure 9:
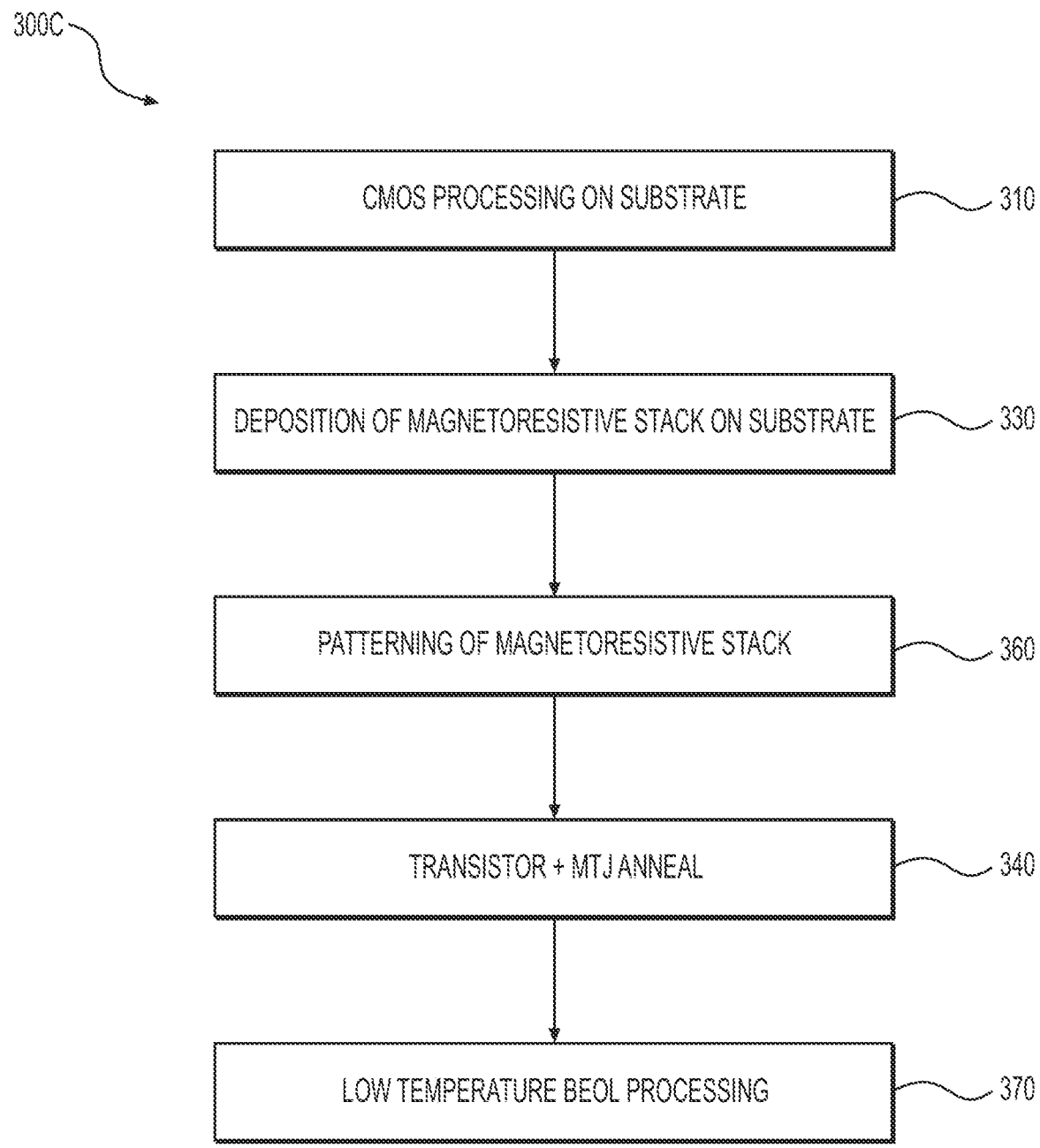

FIG. 9 is a flow chart of another exemplary method 300C of fabricating an MTJ device by combining the transistor and MTJ annealing steps. Similar to method 300B of FIG. 8, in method 300C of FIG. 9, the transistor anneal and the MTJ anneal processes are combined into a single annealing process (step 340). However, in method 300C, this single annealing step (i.e., step 340) is performed after patterning one or more layers/regions of the magnetoresistive stack 100 (i.e., step 360). Specifically, the combined transistor and MTJ anneal step 340 may be performed after (i) patterning a fixed magnetic region (e.g., regions 30, 70) of magnetoresistive stack 100, (ii) after patterning a fixed magnetic region (e.g., regions 30, 70) of magnetoresistive stack 100 and deposition/formation of an encapsulation layer (e.g., encapsulant 130 which may include a silicon nitride encapsulation layer) on the fully patterned or formed magnetoresistive stack 100 (or MTJ bit 120) and before deposition/formation of an interlayer dielectric, and/or (iii) after patterning a fixed magnetic region (e.g., regions 30, 70) of the magnetoresistive stack 100 and deposition/formation of an interlayer dielectric (for example, a silicon nitride ILD) on a fully patterned or formed magnetoresistive stack 100 (or MTJ bit 120), or over a fully patterned or formed magnetoresistive stack 100 (or MTJ bit 120), which may include an encapsulation layer (e.g., encapsulant 130) disposed on the fully patterned or formed magnetoresistive stack 100 (or MTJ bit 120). As those of ordinary skill in the art will readily recognize, the combination transistor anneal and MTJ anneal process, i.e., step 340, may be combined into one etch process, or implemented or performed sequentially in either order. After annealing, low temperature BEOL processing (step 370) may be carried out on the MTJ bits 120 to form an MTJ device. As explained previously, during low temperature BEOL processing, the maximum temperature may be maintained below the temperature limitations/specifications of the transistors and/or the MTJ bits, or at or below the maximum temperature that the stack is subject to during annealing (i.e., step 340).

In one or more aspects, the present disclosure is directed to a method of manufacturing a magnetoresistive device. In one example a method may include forming one or more regions of a magnetoresistive stack on a substrate, wherein the substrate includes at least one electronic device. The method also may include performing a sole annealing process on the substrate having the one or more magnetoresistive regions formed thereon, wherein the sole annealing process is performed at a first minimum temperature. Subsequent to performing the sole annealing process, the method may include patterning or etching at least a portion of the magnetoresistive stack. Moreover, subsequent to the step of patterning or etching the portion of the magnetoresistive stack, the method may include performing all additional processing on the substrate at a second temperature below the first minimum temperature.

In various embodiments the method may include one or more of the following additional aspects: the at least one electronic device may be a transistor; the one or more regions of the magnetoresistive stack may include a fixed region, a free region, and an intermediate region disposed between the fixed region and the free region; the one or more regions of the magnetoresistive stack may include a fixed region, a free region, and dielectric region disposed between the fixed region and the free region; the first minimum temperature may be 300° C.; the magnetoresistive stack may be a magnetic tunnel junction; the one or more regions of the magnetoresistive stack may include a fixed region, a free region, and dielectric region disposed between the fixed region and the free region, and wherein patterning or etching at least a portion of the magnetoresistive stack includes patterning or etching the dielectric region; the one or more regions of the magnetoresistive stack may include a fixed region, a free region, and dielectric region disposed between the fixed region and the free region, and wherein patterning or etching at least a portion of the magnetoresistive stack may include patterning or etching the fixed region; and the magnetoresistive device may be a magnetic memory device.

In another aspect, a method of manufacturing a magnetoresistive device may include forming one or more regions of a magnetoresistive stack on a substrate, wherein the substrate may include at least one electronic device; patterning or etching at least a portion of the magnetoresistive stack; subsequent to the step of patterning or etching the portion of the magnetoresistive stack, performing a sole annealing process on the substrate having the one or more magnetoresistive regions formed thereon, wherein the sole annealing process is performed at a first minimum temperature; and subsequent to the sole annealing process, performing all additional processing on the substrate at a second temperature below the first minimum temperature.

In various embodiments the method may include one or more of the following additional aspects: the at least one electronic device may be a transistor; the one or more regions of the magnetoresistive stack may include a fixed region, a free region, and an intermediate region disposed between the fixed region and the free region; the one or more regions of the magnetoresistive stack may include a fixed region, a free region, and dielectric region disposed between the fixed region and the free region; the first minimum temperature may be 300° C.; the magnetoresistive stack may be a magnetic tunnel junction; the one or more regions of the magnetoresistive stack may includes a fixed region, a free region, and dielectric region disposed between the fixed region and the free region, and wherein patterning or etching at least a portion of the magnetoresistive stack may include patterning or etching the fixed region; the one or more regions of the magnetoresistive stack may include a fixed region, a free region, and dielectric region disposed between the fixed region and the free region, wherein patterning or etching at least a portion of the magnetoresistive stack includes patterning or etching an entirety of the magnetoresistive stack, and wherein the method further comprises the step of depositing an encapsulant on or over the entirely patterned or etched magnetoresistive stack, wherein the step of depositing the encapsulant is performed prior to performing the sole annealing step; the method further comprises the step of depositing an interlayer dielectric on or over the entirely patterned or etched magnetoresistive stack, and wherein the step of depositing the interlayer dielectric is performed after the sole annealing step; the step of patterning or etching at least a portion of the magnetoresistive stack comprises patterning or etching an entirety of the magnetoresistive stack and depositing an interlayer dielectric on or over the entirely patterned or etched magnetoresistive stack or patterning or etching an entirety of the magnetoresistive stack, depositing an encapsulant on or over the entirely patterned or etched magnetoresistive stack, and depositing an interlayer dielectric on or over the encapsulant; and the magnetoresistive device is a magnetic memory device.

Although various embodiments of the present disclosure have been illustrated and described in detail, it will be readily apparent to those skilled in the art that various modifications may be made without departing from the present disclosure or from the scope of the appended claims.

What is claimed is:

1. A method of manufacturing a magnetoresistive device, comprising:
   (a) forming one or more regions of a magnetoresistive stack on a substrate, wherein the substrate includes at least one electronic device, and wherein the one or more regions of the magnetoresistive stack includes a fixed region, a free region, and a dielectric region disposed between the fixed region and the free region;
   (b) patterning or etching at least a portion of the magnetoresistive stack;
   (c) performing a sole annealing process on the substrate having the one or more magnetoresistive regions formed thereon after step (b), wherein the sole annealing process is performed at a first temperature between about 400-500° C. and is a combined annealing step configured to anneal both the at least one electronic device and the one or more regions formed on the substrate, and wherein the sole annealing process is performed after patterning or etching the free region and before patterning or etching the dielectric region; and
   (d) subsequent to step (c), performing all additional processing on the substrate at a second temperature below the first temperature.

2. The method of claim 1, wherein the at least one electronic device is a transistor.

3. The method of claim 1, wherein patterning or etching at least a portion of the magnetoresistive stack includes patterning or etching the fixed region.

4. The method of claim 1, wherein the at least one electronic device in the substrate is not annealed prior to performing the sole annealing process.

5. The method of claim 1, wherein performing the sole annealing process includes exposing the substrate with the one or more magnetoresistive regions formed thereon to a pressure between about 1-6 atmospheres.

6. A method of manufacturing a magnetoresistive device, comprising:
   forming multiple regions of a magnetoresistive stack on a substrate, wherein the substrate includes at least one electronic device;
   patterning or etching a first portion of the magnetoresistive stack;
   subsequent to the step of patterning or etching the first portion of the magnetoresistive stack, performing an annealing process on the substrate having the magnetoresistive stack formed thereon, wherein the annealing process is performed after patterning or etching some of the multiple regions of the magnetoresistive stack and before patterning or etching all of the multiple regions of the magnetoresistive stack, wherein the annealing process is performed at a first temperature between about 400-500° C. and is a combined annealing step configured to anneal both the at least one electronic device and the one or more regions formed on the substrate;
   subsequent to the annealing process, patterning or etching a second portion of the magnetoresistive stack; and
   performing all additional processing on the substrate at a second temperature below the first temperature.

7. The method of claim 6, wherein the at least one electronic device is a transistor.

8. The method of claim 6, wherein the multiple regions of the magnetoresistive stack includes a fixed region, a free region, and an intermediate region disposed between the fixed region and the free region, and wherein (a) patterning or etching the first portion includes patterning or etching regions of the magnetoresistive stack above the intermediate region, and (b) patterning or etching the second portion includes patterning or etching regions of the magnetoresistive stack below the first portion.

9. The method of claim 6, wherein the multiple regions of the magnetoresistive stack includes a fixed region, a free region, and a dielectric region disposed between the fixed region and the free region, and wherein the first portion includes at least the fixed region, the free region, and the dielectric region, and the second portion incudes regions of the magnetoresistive stack below the first portion.

10. The method of claim 6, wherein the magnetoresistive stack is a magnetic tunnel junction.

11. The method of claim 6, wherein the multiple regions of the magnetoresistive stack includes a fixed region, a free region, and a dielectric region disposed between the fixed region and the free region, and wherein patterning or etching the first portion includes patterning or etching at least the fixed region.

12. The method of claim 6, wherein the annealing process is performed at a pressure between about 1-6 atmospheres.

13. The method of claim 6, wherein the at least one electronic device on the substrate is not annealed prior to performing the annealing process.

14. A method of manufacturing a magnetoresistive device, comprising:
   forming a magnetoresistive stack on a substrate, wherein the magnetoresistive stack includes multiple layers formed on the substrate and wherein the substrate includes one or more transistors;
   after forming the magnetoresistive stack, performing a combined annealing process, wherein the combined annealing process anneals both the one or more transistors and the magnetoresistive stack, and wherein the combined annealing process is performed at a temperature between about 400-500° C. and a pressure between about 1-6 atmospheres;
   patterning or etching at least a portion of the magnetoresistive stack, wherein the combined annealing process is performed after patterning or etching some of the multiple layers and before patterning or etching all of the multiple layers; and
   performing all additional processing on the substrate at a temperature below a maximum temperature of the combined annealing process.

15. The method of claim 14, wherein the one or more transistors on the substrate is not annealed prior to performing the combined annealing process.

16. The method of claim 14, wherein the combined annealing process is performed during the step of patterning or etching the magnetoresistive stack.

17. The method of claim 14, wherein the magnetoresistive stack includes a fixed region, a free region, and a dielectric region disposed between the fixed region and the free region, and wherein the combined annealing process is performed after patterning or etching at least a portion of one or more of the fixed region, the free region, and the dielectric region.

* * * * *